United States Patent
Takasu et al.

(10) Patent No.: US 11,370,076 B2
(45) Date of Patent: Jun. 28, 2022

(54) RAMO4 SUBSTRATE AND MANUFACTURING METHOD THEREOF

(71) Applicant: Panasonic Intellectual Property Management Co., Ltd., Osaka (JP)

(72) Inventors: Yoshifumi Takasu, Osaka (JP); Yoshio Okayama, Osaka (JP); Akihiko Ishibashi, Osaka (JP); Isao Tashiro, Osaka (JP); Akio Ueta, Hyogo (JP); Masaki Nobuoka, Nara (JP); Naoya Ryoki, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 272 days.

(21) Appl. No.: 15/424,244

(22) Filed: Feb. 3, 2017

(65) Prior Publication Data
US 2017/0239773 A1    Aug. 24, 2017

(30) Foreign Application Priority Data

Feb. 23, 2016  (JP) .............................. JP2016-032352
Nov. 8, 2016  (JP) .............................. JP2016-218202

(51) Int. Cl.
*C30B 29/22* (2006.01)
*B24B 7/22* (2006.01)
*C30B 33/00* (2006.01)

(52) U.S. Cl.
CPC ................ *B24B 7/22* (2013.01); *C30B 29/22* (2013.01); *C30B 33/00* (2013.01)

(58) Field of Classification Search
CPC ......... C30B 25/02; C30B 19/12; C30B 25/18; C30B 29/16; C30B 29/22; C30B 33/00;
(Continued)

(56) References Cited

U.S. PATENT DOCUMENTS 6,303,405 B1 * 10/2001 Yoshida ............ H01L 21/76251
                                                              257/E21.567
6,727,522 B1 *  4/2004 Kawasaki ............... H01L 27/15
                                                              257/102
(Continued)

FOREIGN PATENT DOCUMENTS

JP     2007-297263 A    11/2007
JP     2009-172717 A     8/2009
(Continued)

OTHER PUBLICATIONS

Bib data and translation—JP-2013102023-A; Yoshii, Motoyasu; May 2013 (Year: 2013).*

(Continued)

*Primary Examiner* — Humera N. Sheikh
*Assistant Examiner* — Elizabeth D Ivey
(74) *Attorney, Agent, or Firm* — McDermott Will & Emery LLP

(57) ABSTRACT

A RAMO$_4$ substrate includes a single crystal represented by a formula of RAMO$_4$ (in the formula, R indicates one or a plurality of trivalent elements selected from a group consisting of Sc, In, Y, and a lanthanoid element, A indicates one or a plurality of trivalent elements selected from a group consisting of Fe(III), Ga, and Al, and M indicates one or a plurality of bivalent elements selected from a group consisting of Mg, Mn, Fe(II), Co, Cu, Zn, and Cd). An epitaxially-grown surface is provided on one surface of the RAMO$_4$ substrate, a satin-finish surface is provided on another surface. The satin-finish surface has surface roughness which is larger than that of the epitaxially-grown surface.

5 Claims, 16 Drawing Sheets

(58) Field of Classification Search
CPC ... C30B 23/02; C30B 23/025; C01F 17/0025; B82Y 30/00; B82Y 40/00; B82Y 25/00; B24B 7/22; B24B 37/042; B32B 15/08; B32B 15/20; B32B 2037/1253; B32B 2038/0076; B32B 2255/10; B32B 2255/20; B32B 2255/205; B32B 2262/103; B32B 2262/106; B32B 2264/105; B32B 2264/108; B32B 2307/202; B32B 2307/302; B32B 2309/02; B32B 2309/105; B32B 2379/08; B32B 2457/00; B32B 2457/08; B32B 27/06; B32B 27/18; B32B 27/20; B32B 27/281; B32B 37/1284; B32B 37/144; B32B 37/16; B32B 7/02; B32B 7/12; B32B 9/005; B32B 9/045

See application file for complete search history.

(56) References Cited

U.S. PATENT DOCUMENTS

| | | |
|---|---|---|
| 2006/0236922 A1 | 10/2006 | Ishibashi et al. |
| 2007/0228400 A1 | 10/2007 | Fujita et al. |
| 2010/0189146 A1 | 7/2010 | Bessho et al. |
| 2012/0015143 A1* | 1/2012 | Chyan .................. B82Y 30/00 428/141 |
| 2012/0112158 A1 | 5/2012 | Chyan et al. |
| 2016/0032486 A1* | 2/2016 | Hansen ................ C30B 23/025 117/106 |

FOREIGN PATENT DOCUMENTS

| | | | |
|---|---|---|---|
| JP | 2010-047463 A | | 3/2010 |
| JP | 2010-258050 A | | 11/2010 |
| JP | 2012-064886 A | | 3/2012 |
| JP | 2012064886 A | * | 3/2012 |
| JP | 2013102023 A | * | 5/2013 |
| JP | 2015-178448 | | 10/2015 |

OTHER PUBLICATIONS

Bib data and translation—JP-2012064886-A; Inoue, Koji; Mar. 2012 (Year: 2012).*

* cited by examiner

PRIOR ART

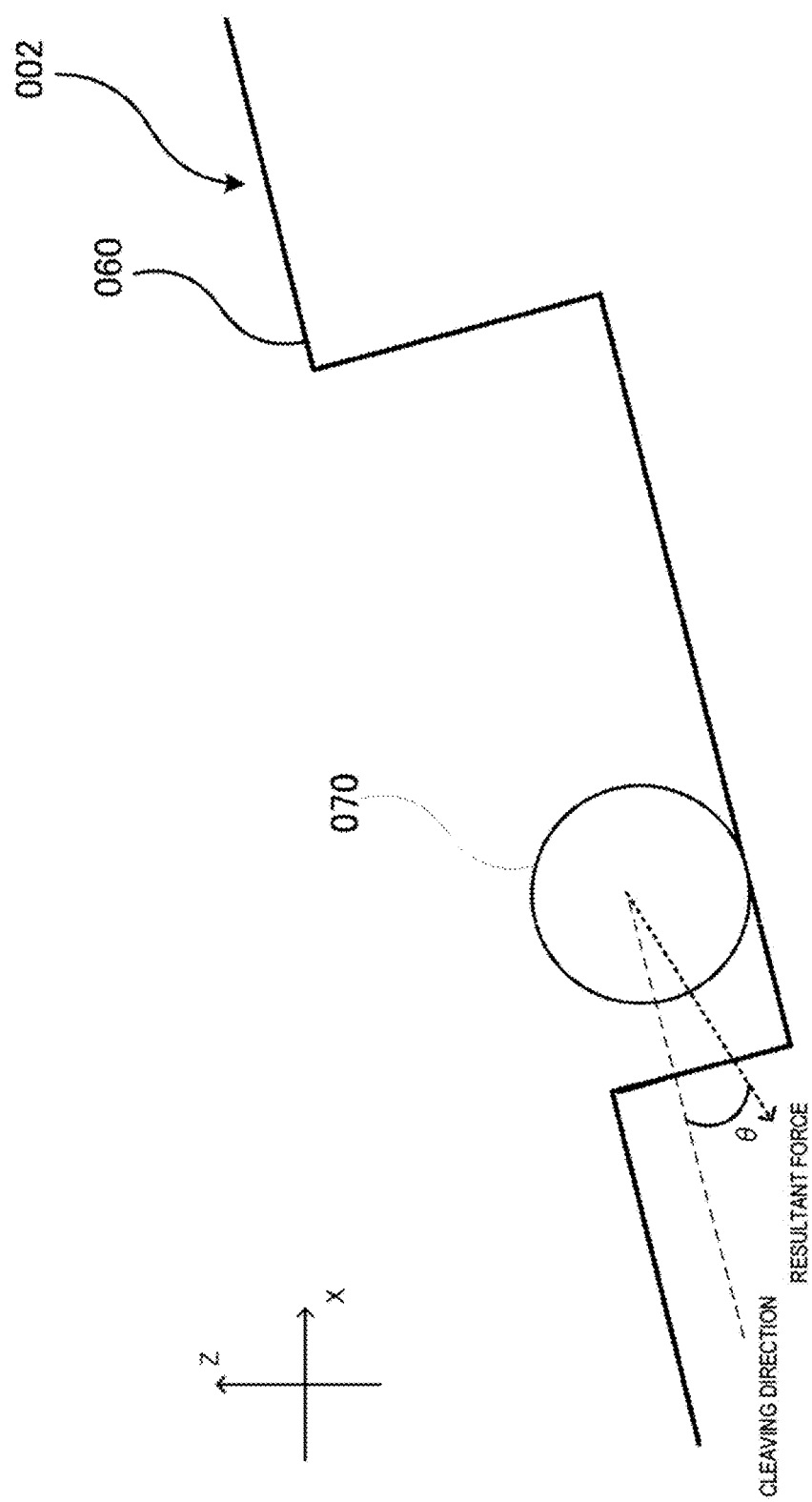

RAMO4 SUBSTRATE AND MANUFACTURING METHOD THEREOF

TECHNICAL FIELD

The technical field relates to a $RAMO_4$ substrate and a manufacturing method thereof.

BACKGROUND

A $RAMO_4$ substrate is formed from single crystal represented by a formula of $RAMO_4$ (in the formula, R indicates one or a plurality of trivalent elements selected from a group consisting of Sc, In, Y, and a lanthanoid element, A indicates one or a plurality of trivalent elements selected from a group consisting of Fe(III), Ga, and Al, and M indicates one or a plurality of bivalent elements selected from a group consisting of Mg, Mn, Fe(II), Co, Cu, Zn, and Cd). As one of such a $RAMO_4$ substrate, a $ScAlMgO_4$ substrate is known. A $ScAlMgO_4$ substrate is used as a substrate for growing nitride semiconductor such as GaN (see Japanese Patent Unexamined Publication No. 2015-178448, for example). FIG. 1 illustrates an example of a manufacturing method of a conventional $ScAlMgO_4$ substrate disclosed in Japanese Patent Unexamined Publication No. 2015-178448. The conventional $ScAlMgO_4$ substrate is manufactured by cleaving a $ScAlMgO_4$ bulk material.

SUMMARY

However, it is difficult to obtain a $RAMO_4$ substrate having a desired surface shape, only by cleaving. Further, a substrate having higher quality is required. That is, an object of the disclosure is to provide a substrate having higher quality.

To solve the above object, as well as other concerns, according to the disclosure, a $RAMO_4$ substrate comprises a single crystal represented by a formula of $RAMO_4$ (in the formula, R indicates one or a plurality of trivalent elements selected from a group consisting of Sc, In, Y, and a lanthanoid element, A indicates one or a plurality of trivalent elements selected from a group consisting of Fe(III), Ga, and Al, and M indicates one or a plurality of bivalent elements selected front a group consisting of Mg, Mn, Fe(II), Co, Cu, Zn, and Cd). An epitaxially-grown surface is provided on a first surface of the $RAMO_4$ substrate, and a satin-finish surface is provided on a second surface thereof. The satin-finish surface has surface roughness which is larger than that of the epitaxially-grown surface.

According to the disclosure, it is possible to provide a $RAMO_4$ substrate having higher quality.

BRIEF DESCRIPTION OF THE DRAWINGS

FIG. 13 is a diagram illustrating a force applied when an epitaxially-grown surface having a plurality of cleavage surfaces is formed.

DESCRIPTION OF EMBODIMENTS

Hereinafter, an embodiment of the disclosure will be described with reference to the drawings.

Firstly, knowledge leading to the disclosure will be described. As described in Patent Literature 1, in the related art, a $ScAlMgO_4$ substrate is manufactured by cleaving a $ScAlMgO_4$ bulk material. If a back surface (non-epitaxially-grown surface) of the $ScAlMgO_4$ substrate is formed by cleaving, a portion of the surface shape thereof easily has a mirror surface shape. Thus, when exposure treatment is performed in order to form a pattern of a device structure or a wiring structure on an epitaxially-grown surface, light from the back surface is easily reflected. Thus, a phenomenon of double patterning occurs by the reflected light, and thus accuracy of patterning may be degraded. If the $ScAlMgO_4$ substrate is manufactured by cleaving, the epitaxially-grown surface and the back surface (non-epitaxially-grown surface) easily have a similar surface shape. Thus, distinguishment between the front surface and the back surface is difficult in handling, and accordingly, confusion may occur. Further, if the back surface has a mirror shape surface, when the $ScAlMgO_4$ substrate is installed on a flat surface such as a stage of a manufacturing device, the ScAlMgO$_4$ substrate is easily slipped, and reliable fixation of the ScAlMgO$_4$ substrate is difficult. Thus, an unevenness shape which is relatively coarse and uniform is desirably formed on the back surface side of the ScAlMgO$_4$ substrate. However, forming such an unevenness shape is difficult only by cleaving.

Regarding the epitaxially-grown surface side, machining to obtain a desired shape is also difficult only by the cleaving. Specifically, if the epitaxially-grown surface is formed only by cleaving, steps having a height of 500 nm or more easily occur on the epitaxially-grown surface. If a step portion having a height of 500 nm or more is provided on the epitaxially-grown surface, inconvenience occurs when crystal is caused to epitaxially grow on the substrate. A disadvantage in a case where a step having a height of 500 nm or more is provided on the epitaxially-grown surface of the substrate will be described. If crystal such as GaN is produced on an epitaxially-grown surface in which a step having a height of 500 nm or more is provided, a crystal orientation at the step portion having a height of 500 nm or more is different from a crystal orientation at other portions. For example, if an InGaN layer used for an LED light emission layer is formed on an epitaxially-grown surface by a metal-organic chemical vapor deposition (MOCVD) method, the composition of indium at the step portion is different from that at a flat portion. If the composition of indium varies, emitted light wavelength and brightness when being used as an LED element are changed. As a result, light emission unevenness when being used as an LED element occurs, and deterioration of brightness is caused.

Figure 1:
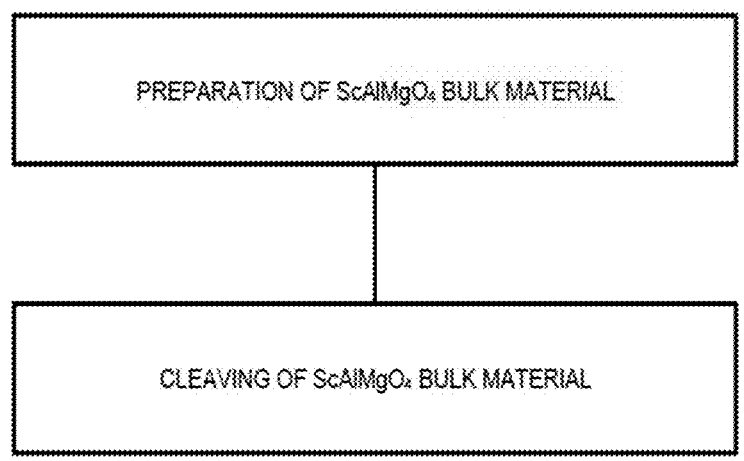
FIG. 1 is a diagram illustrating a manufacturing processing of a conventional $ScAlMgO_4$ substrate.
Figure 2A:
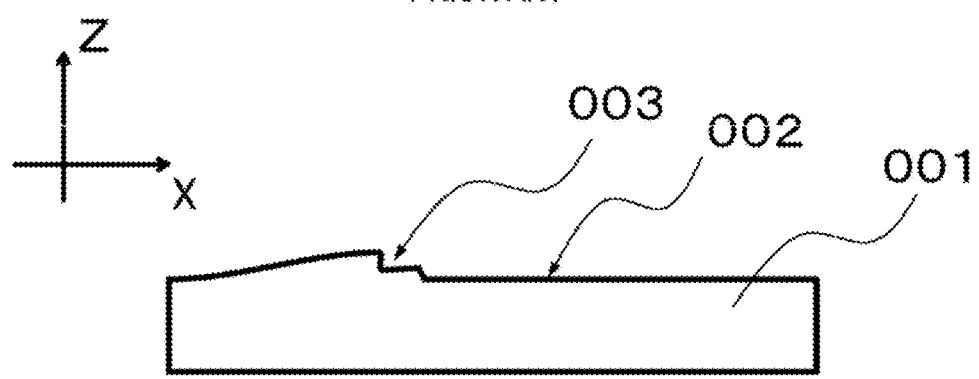
FIG. 2A is a side view illustrating the conventional $ScAlMgO_4$ substrate.
Figure 2B:
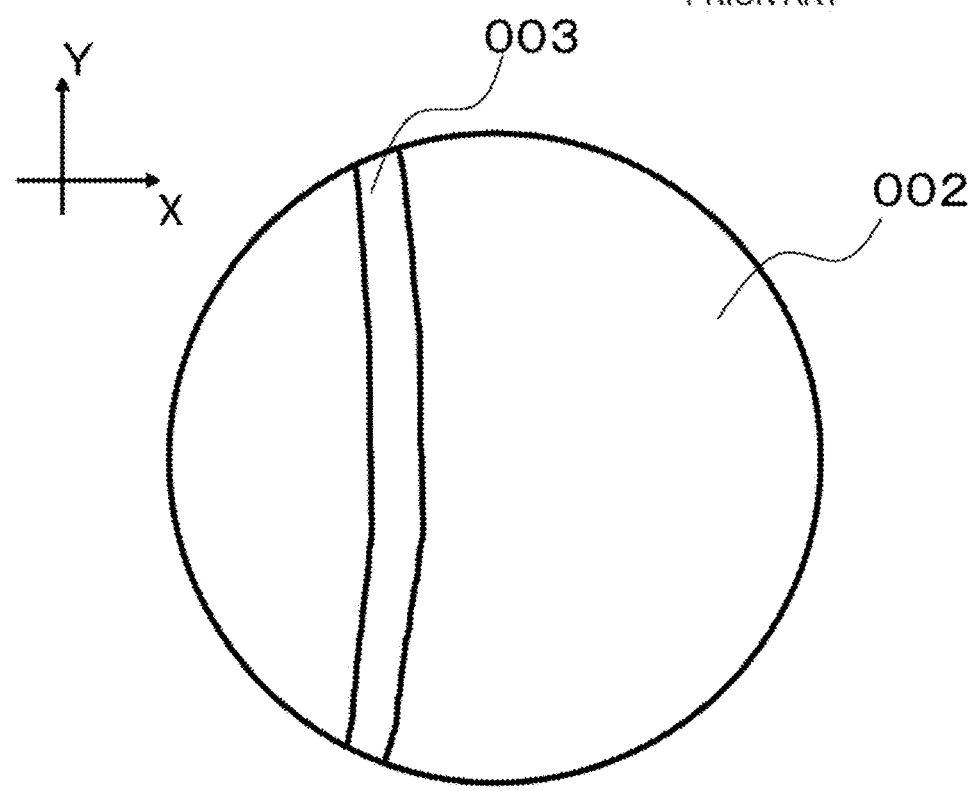
FIG. 2B is a plan view illustrating the conventional $ScAlMgO_4$ substrate.
Figure 3:
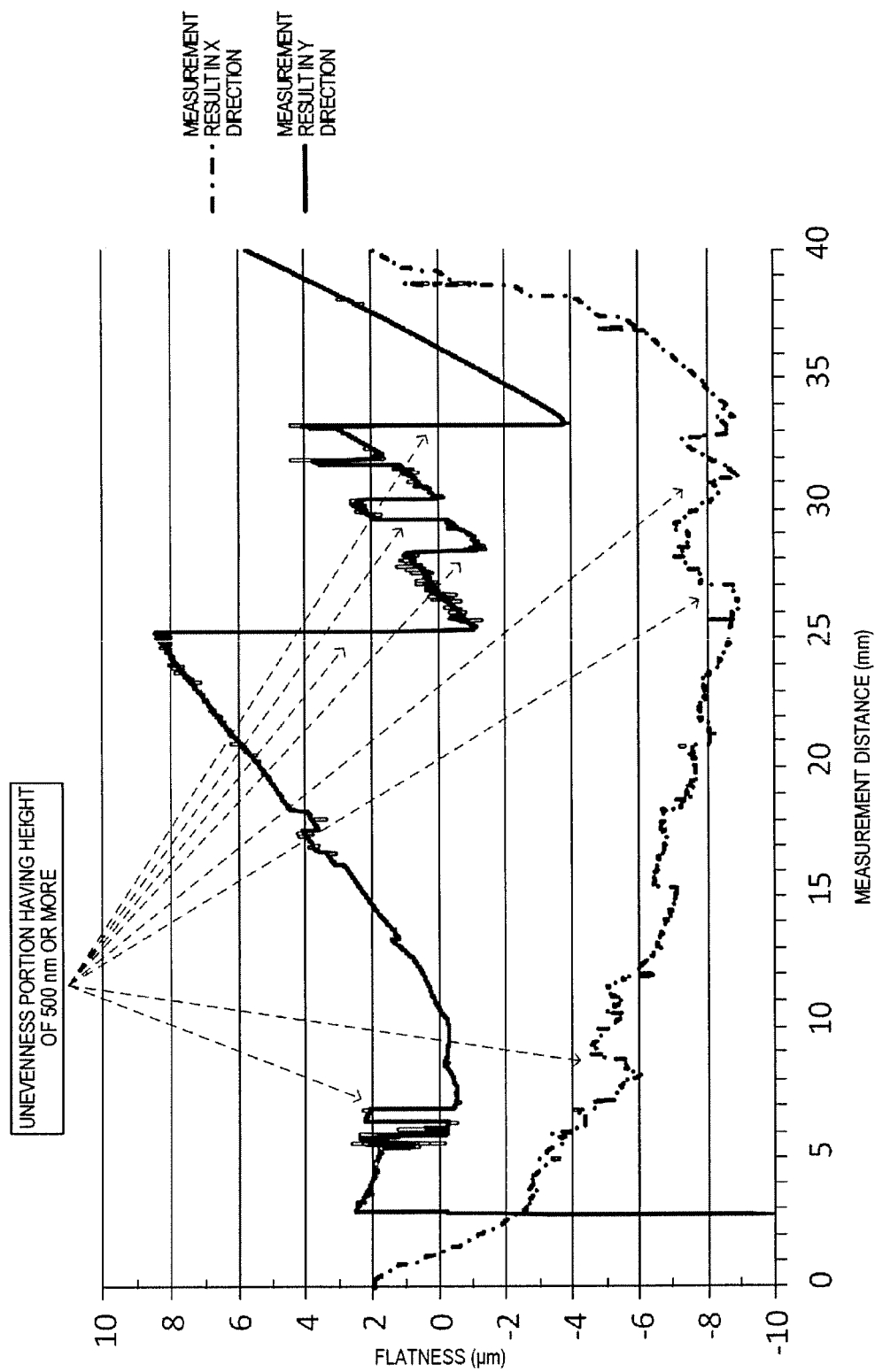
FIG. 3 is a diagram illustrating a result obtained by measuring flatness of a conventional epitaxially-grown surface which is formed only by cleaving.

FIG. 2A is a side view illustrating a conventional ScAlMgO$_4$ substrate 001. FIG. 2B is a plan view illustrating the substrate 001. As illustrated in FIGS. 2A and 2B, step portion 003 is easily formed on a cleavage surface (epitaxially-grown surface 002) of ScAlMgO$_4$ substrate 001, and the height of step portion 003 is equal to or more than 500 nm. FIG. 3 illustrates data obtained by measuring flatness of epitaxially-grown surface 002 of ScAlMgO$_4$ substrate 001 which has been formed by cleaving. The data is obtained in such a manner that ScAlMgO$_4$ substrate 001 of φ40 mm is measured in X and Y axes orthogonal to each other in the same plane, by using a laser reflection type wavelength measurement device (NH-3MA manufactured by Mitaka Kohki Co., Ltd.). In FIG. 3, a portion indicated by an arrow corresponds to an unevenness portion of 500 nm or higher. It is considered that exfoliation during cleaving occurs in a cleaving direction and the force varies, and thus cleaving in the same atomic layer is not caused, and as a result, an unevenness portion formed, from steps of 500 nm or higher occurs in the ScAlMgO$_4$ substrate.

On the contrary, in the disclosure, a manufacturing method of a ScAlMgO$_4$ substrate which includes an epitaxially-grown surface on one surface, and a satin-finish surface having surface roughness which is larger than that of the epitaxially-grown surface is provided.

Figure 4:
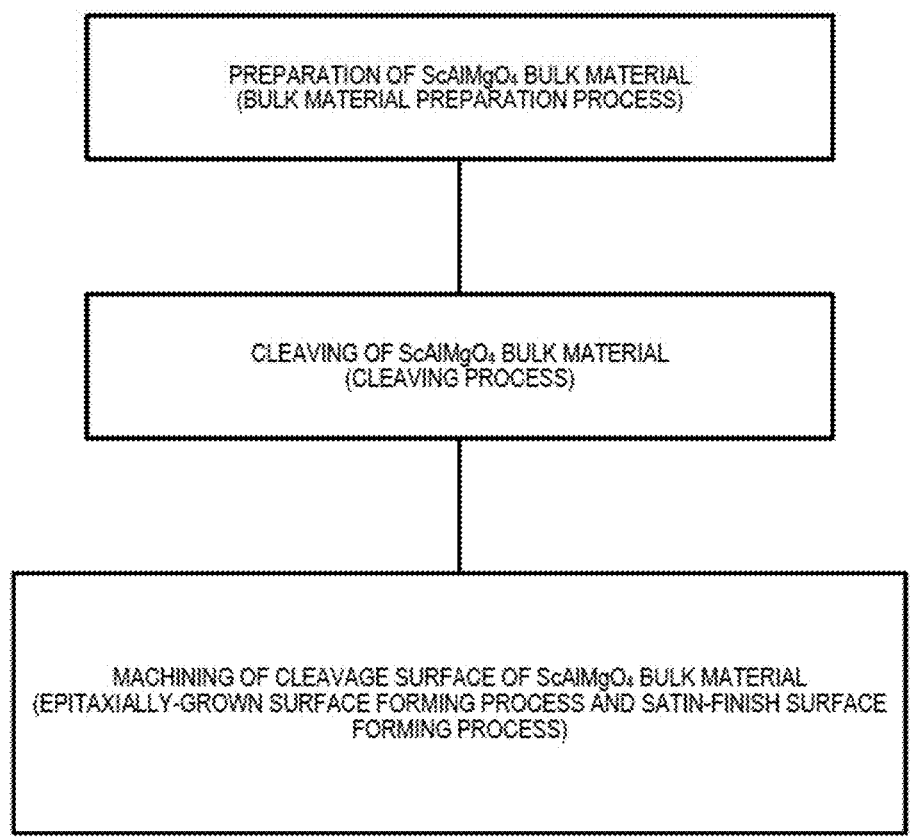
FIG. 4 is a diagram illustrating a manufacturing process of a $ScAlMgO_4$ substrate according to an embodiment of the disclosure.

FIG. 4 illustrates processes of a manufacturing method of a ScAlMgO$_4$ substrate according to the embodiment. The manufacturing method according to the disclosure includes a process (bulk material preparation process) of preparing a ScAlMgO$_4$ bulk material, a process (cleaving process) of cleaving the prepared bulk material so as to perform division and form a substrate, and a process (epitaxially-grown surface forming process and satin-finish surface forming process) of machining a surface corresponding to an epitaxially-grown surface of the substrate, and a surface on an opposite side.

In the bulk material preparation process, for example, a single crystal ScAlMgO$_4$ ingot manufactured by using a high-frequency induction heating type Czochralski furnace is prepared. As a manufacturing method of the ingot, for example, as a starting material, Sc$_2$O$_3$, Al$_2$O$_3$, and MgO having purity of 4N (99.99%) are mixed with a predetermined molar ratio. 3400 g of the starting material is put into a crucible which is formed of iridium and has a diameter of 100 mm. Then, the crucible into which the raw material has been put is put into a growing furnace of a high-frequency induction heating type Czochralski furnace, and the inside of the furnace is vacuumed. Then, nitrogen is put into the furnace, and heating the crucible is started at a time point when pressure in the furnace reaches the atmospheric pressure. Heating is gradually performed for 12 hours until the temperature of the furnace reaches a melting point of ScAlMgO$_4$, and thus the material is molten. Then, ScAlMgO$_4$ single crystal which has been cut out at the (0001) orientation is used as seed crystal, so as to drop the seed crystal up to the near of a molten liquid in the crucible. The seed crystal is gradually dropped while being rotated at a constant rotation speed. While a tip end of the seed crystal is brought into contact with the molten liquid to gradually lower the temperature, the seed crystal is pulled up (pulled up in a [0001] axis direction) at a speed, that is, a pulling speed of 0.5 mm/h, and thus crystal growth is performed. Thus, a single crystal ingot which has a diameter of 50 mm and a straight body portion having a length of 50 mm is obtained.

Here, ScAlMgO$_4$ single crystal will be described. ScAlMgO$_4$ single crystal has a structure in which a ScO$_2$ layer like a (111) plane having a rocksalt structure, and an AlMgO$_2$ layer like a (0001) plane of hexagonal crystal are alternately stacked. Two layers like the (0001) plane of hexagonal crystal are flat in comparison to wurtzite structure. Bonding between an upper layer and a lower layer has a length which is about 0.03 nm longer, and has a force weaker than those of in-plane bonding. Thus, the ScAlMgO$_4$ single crystal can be cleaved in the (0001) plane. The process of dividing the bulk material by cleaving, so as to prepare a plate state (cleaving process) may be performed by using the characteristics.

Properties relating to cleaving of the ScAlMgO$_4$ single crystal may cause the cleaving process to be easily performed. In contrast, machining a cleavage surface by a conventional machining method is difficult. That is, in the conventional machining method, removing an unevenness which is formed on the epitaxially-grown surface side, and has a height of 500 nm or more is not possible. In addition, it is difficult to form a substantially-uniform unevenness on the surface (back surface) on an opposite side of the epitaxially-grown surface without irregularity.

The reason that removing an unevenness having a height of 500 nm or more is not possible on the epitaxially-grown surface side, and forming a substantially-uniform unevenness shape on the back surface without irregularity is not possible, in the conventional machining method will be described below. In descriptions, generally, as an example, a case where machining performed on a semiconductor substrate such as GaN to allow an unevenness on the surface thereof to be less than 500 nm is performed on a ScAlMgO$_4$ substrate will be described. A machining area is set to have 10 mm angle.

Figure 5:
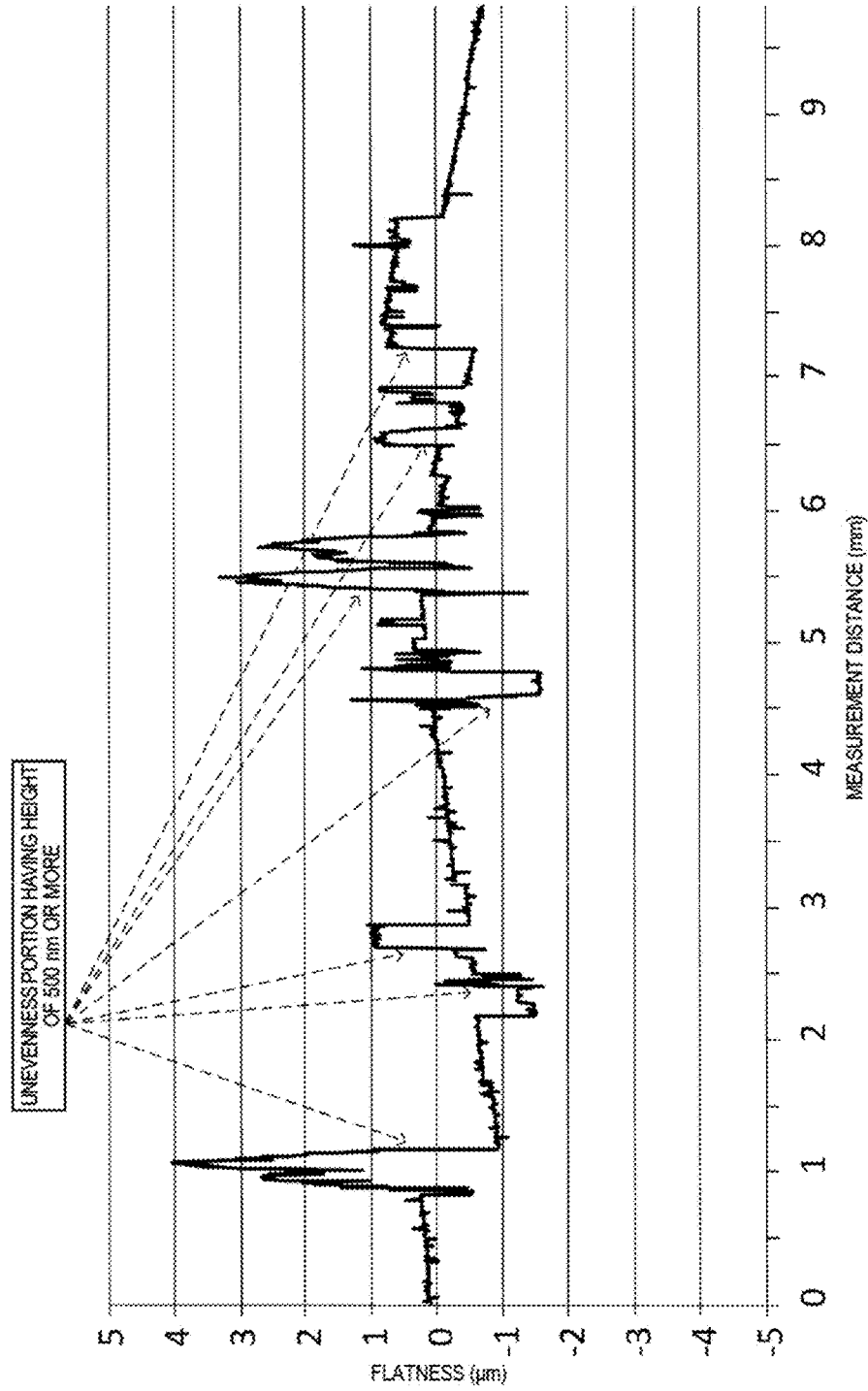
FIG. 5 is a diagram illustrating a result obtained by measuring flatness when a $ScAlMgO_4$ cleavage surface is polished by using diamond slurry of 2 µm.

Firstly, lap polishing is performed on a cleavage surface of ScAlMgO$_4$ by using diamond slurry (abrasive grain). The diamond slurry has a size having a diameter of 2 μm, and is used in conventional coarse polishing. FIG. 5 illustrates a result obtained by lap polishing. FIG. 5 illustrates a result obtained in such a manner that flatness of a sectional shape of the surface obtained by machining is measured in the X direction by the above-described laser reflection type length measurement device. As illustrated in FIG. 5, it is recognized that, if the machining is performed, an unevenness of 500 nm or higher is formed on the surface. As illustrated in FIG. 5, the unevenness formed by the machining is locally distributed in the cleavage surface. In the lap polishing, the diamond slurry rolls on the surface of $ScAlMgO_4$, and thus the material at a portion at which the diamond slurry rolls is finely removed. However, the single crystal $ScAlMgO_4$ is a stacked body of multiple $ScO_2$ layers and $AlMgO_2$ layers. Thus, it is considered that variation of a machining force causes exfoliation to partially occur at a deep layer. Thus, as illustrated in FIG. 5, it is considered that an unevenness of 500 nm or higher is locally formed.

Figure 6:
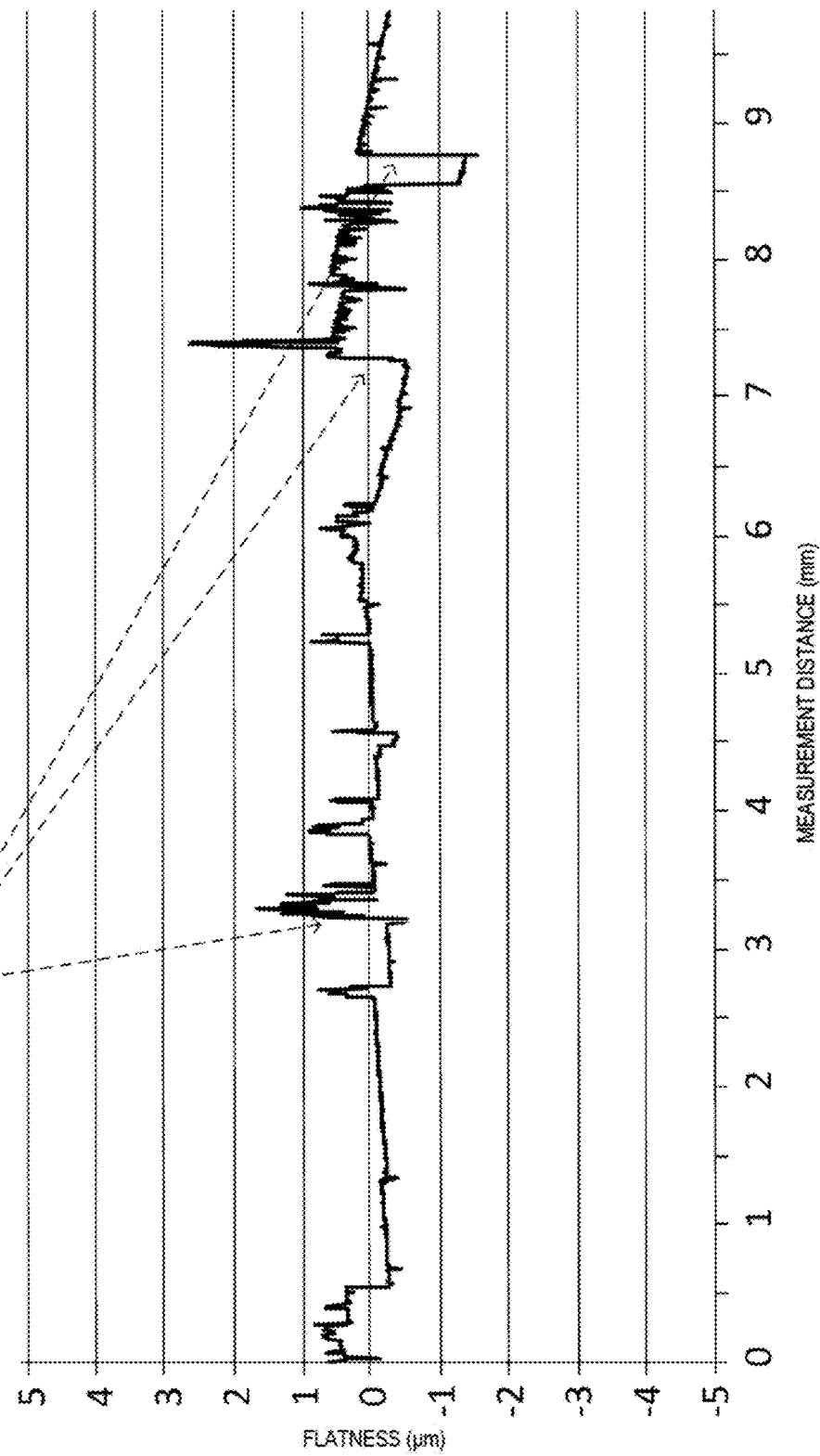
FIG. 6 is a diagram illustrating a result obtained by measuring flatness when a $ScAlMgO_4$ cleavage surface is polished by using diamond slurry of 0.125 µm.

Generally, in order to reduce such variation of a machining force, it is effective to set the size of the abrasive grain to be smaller than the allowable size of the unevenness. FIG. 6 illustrates a result in a case where lap polishing is performed on the cleavage surface of $ScAlMgO_4$ by using diamond slurry which has a size of a diameter of 0.125 μm, as the abrasive grain. At this time, as a method of measuring flatness in the X direction, a method similar to that in a case where polishing is performed by using diamond slurry which has a size of a diameter of 2 μm is applied. As illustrated in FIG. 6, even though the size of the abrasive grain is set to be smaller than the allowable size (500 nm) of the unevenness, the unevenness of 500 nm or higher is locally formed.

Figure 7:
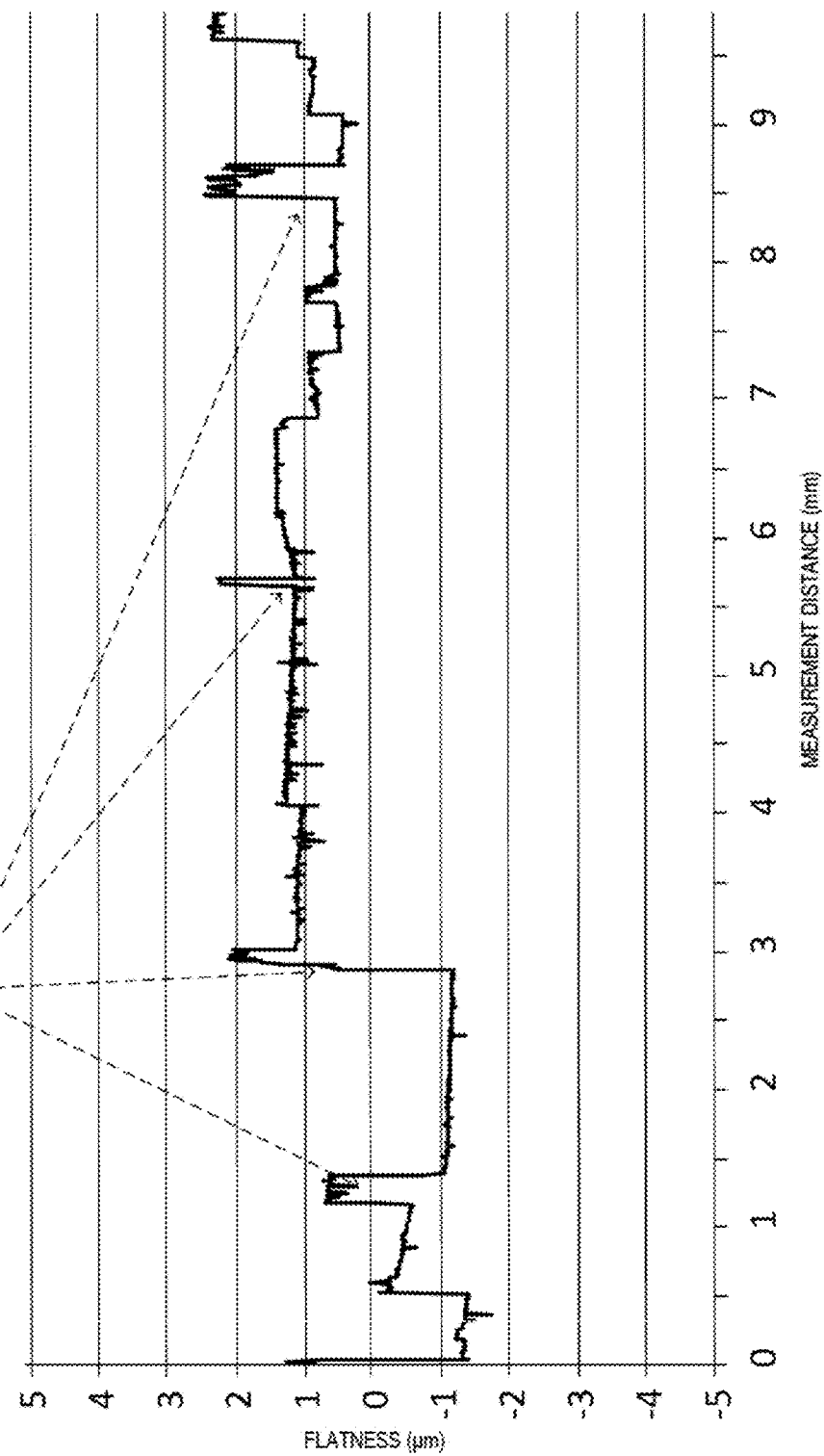
FIG. 7 is a diagram illustrating a result obtained by measuring flatness when a $ScAlMgO_4$ cleavage surface is polished by using colloidal silica.

Hardness or the shape of an abrasive grain in accordance with the type of an abrasive grain also has an influence on a surface shape of the polished surface. FIG. 7 illustrates a result obtained by performing polishing with a colloidal silica abrasive grain which is softer and has a shape more approximate to a sphere, than diamond. Polishing is performed with a pressing force of 1000 Pa, when machining GaN single crystal is generally performed. At this time, as a method of measuring flatness in the X direction, a method similar to that in a case where polishing is performed by using diamond slurry which has a size of a diameter of 2 μm is applied. As illustrated in FIG. 7, according to this method, a fine unevenness can be removed, but removing an unevenness having a height of 500 nm or more is not possible. Further, an additional unevenness is locally formed.

As described above, even though polishing using any free abrasive grain is performed, causing an unevenness on an epitaxially-grown surface of a $ScAlMgO_4$ substrate to be less than 500 nm is not possible, and forming a substantially-uniform unevenness on the entire surface of the substrate without irregularity is not possible.

Figure 8:
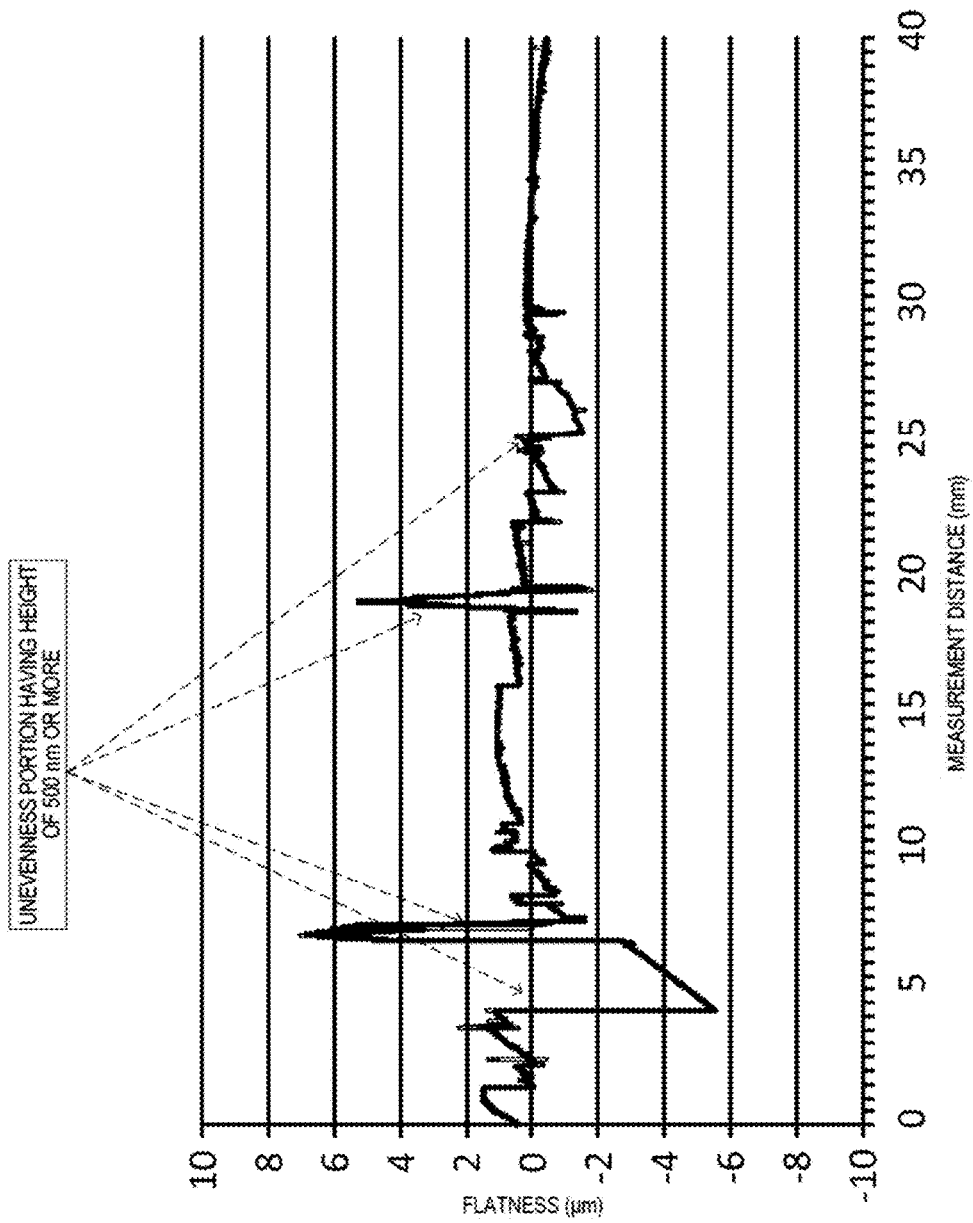
FIG. 8 is a diagram illustrating a result obtained by measuring flatness when a $ScAlMgO_4$ cleavage surface is polished by machining with diamond-fixed abrasive grains of 0.5 µm.

Grinding is performed by using a diamond-fixed abrasive grain which has a size of a diameter of 0.5 μm. FIG. 8 illustrates a result. At this time, as a method of measuring flatness in the X direction, a method similar to that in a case where polishing is performed by using diamond slurry which has a size of a diameter of 2 μm is applied. As illustrated in FIG. 8, an unevenness of 500 nm or higher is formed even by using a fixed abrasive grain. Further, an additional unevenness is locally formed.

From the above results, in the conventional machining method, machining the surface of a $ScAlMgO_4$ substrate to be a smooth surface which does not include an unevenness of 500 nm or higher, is not possible, and forming a substantially-uniform unevenness on the entire surface of the substrate is also difficult. This means the following. That is, even though an unevenness occurring by cleaving is removed, if the proportion of an occupying flat surface to the entirety is large, machining load is easily concentrated on an area portion when the flat surface is machined. Thus, cracks by cleaving occur not on a surface, but in the inside deeper from the surface. Thus, it is considered that the cracked portion is removed, and thus a new unevenness is locally formed. In a case where the proportion of the flat surface is high, an unevenness formed in the cleaving process may be hardly removed only by applying a load which has an extent that cleaving does not occur in the inside thereof.

In the disclosure, when, an epitaxially-grown surface is formed (epitaxially-grown surface forming process), a machining method (coarse unevenness forming, process and fine unevenness forming process) as will be described below is employed considering features of a $ScAlMgO_4$ material. Specifically, an unevenness shape having a substantially-constant height is formed in the entirety of a region functioning as an epitaxially-grown surface of a $ScAlMgO_4$ substrate (coarse unevenness forming process). Then, a pressing force is reduced in stages, and thus an unevenness shape which is formed on the entire surface and has a constant height is gradually reduced while an absolute amount of variation of the pressing force is reduced and cleaving the inside of the surface is prevented (fine unevenness forming process). That is, in the disclosure, at least a cleaving process of cleaving $ScAlMgO_4$ single crystal in a (0001) plane, and preparing an obtained $ScAlMgO_4$ plate, a coarse unevenness forming process of forming an unevenness of 500 nm or higher, on the $ScAlMgO_4$ plate, and a fine unevenness forming process of polishing the unevenness of 500 nm or higher to remove the unevenness of 500 nm or higher are performed. Accordingly, an epitaxially-grown surface is formed on the one surface of the $ScAlMgO_4$ substrate.

Here, in the coarse unevenness forming process, the unevenness shape is distributed in the entire surface of an epitaxially-grown surface, such that any area of regions (also referred to as "flat portions" below) is set to be equal to or smaller than 1 $mm^2$. In the flat portion, the height of the continuous unevenness is equal to or less than 500 nm. The reason is as follows. If the flat portion having an area larger than 1 $mm^2$ is formed in the coarse unevenness forming process, cleaving occurs in the inside thereof by concentration of machining load, in the fine unevenness forming process, and thus an unevenness which is higher than 500 nm is formed. It is preferable that a difference in height between a plurality of protrusions of the unevenness formed in the coarse unevenness forming process converges in a range of ±0.5 μm. An unevenness having a constant height which has variation within this range is formed on the entire surface. Thus, it is possible to gradually reduce the height of an unevenness and to form uniform flat portions in the surface, by the fine unevenness forming process.

In the manufacturing method according to the disclosure, an unevenness having a height of 500 nm or more is formed by using the first abrasive grain in the coarse unevenness forming process. Then, in the fine unevenness forming process, an unevenness having a height which is less than 500 nm is formed by using the second abrasive grain which has hardness lower than that of the first abrasive grain.

Figure 9:
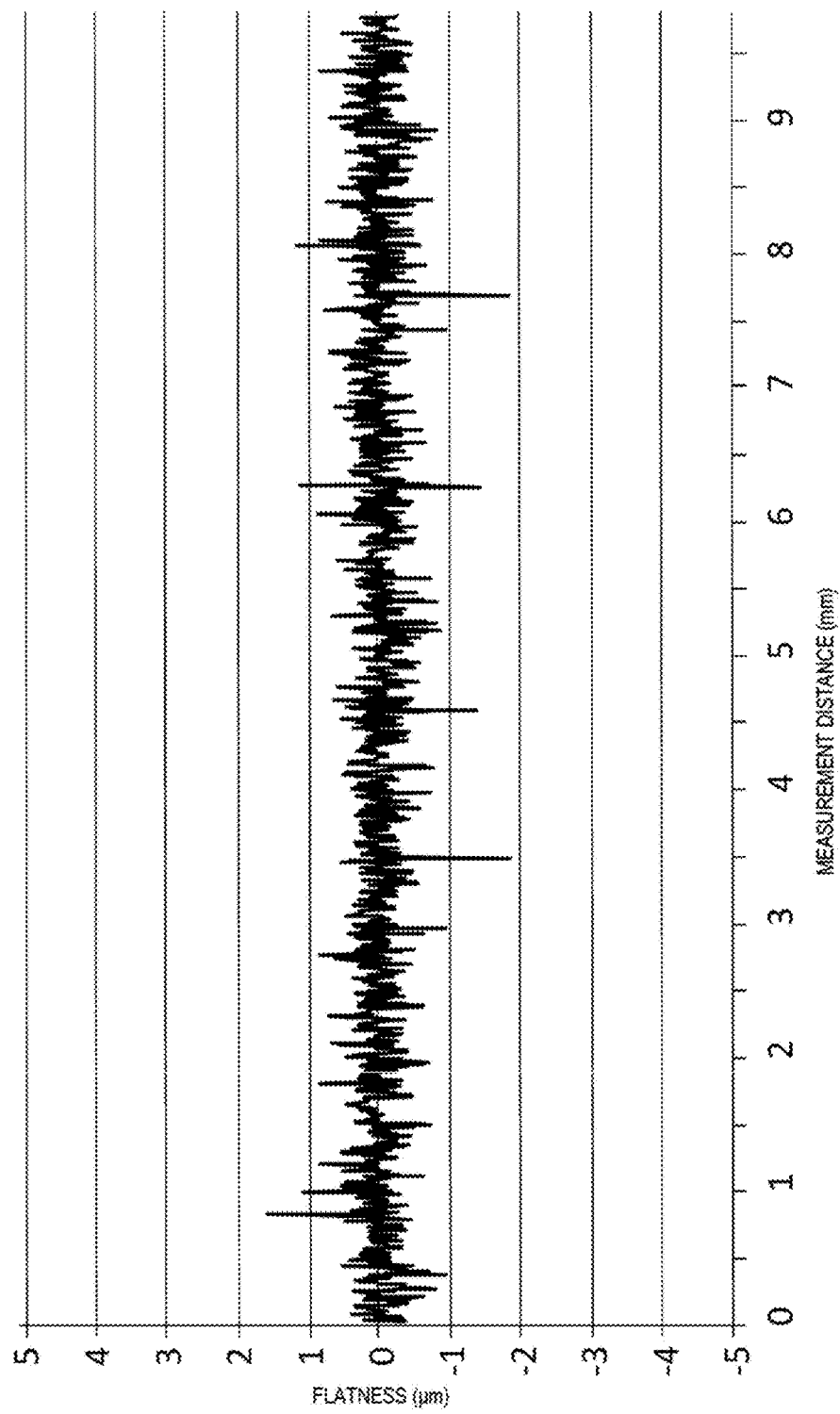
FIG. 9 is a diagram illustrating a result obtained by measuring flatness after grinding by a coarse unevenness forming process is performed in the embodiment of the disclosure.

More detailed, in the unevenness forming process of machining an unevenness shape having a constant height, grinding is performed by using a diamond-fixed abrasive grain having a large abrasive grain size. As the abrasive grain, an abrasive diamond grain of #300 to #20000 (preferably #600) is used. According to machining using an abrasive diamond grain which has a size in this range, the difference in height of an unevenness on a surface subjected to machining converges in a range of ±5 μm. Machining conditions in the coarse unevenness forming process are preferably as follows. The number of rotations of a whetstone is set to be 500 min$^{-1}$ to 50000 min$^{-1}$ (preferably, 1800 min$^{-1}$), the number of rotations of a ScAlMgO$_4$ substrate is set to be 10 min$^{-1}$ to 300 min$^{-1}$ (preferably, 100 min$^{-1}$), the machining speed is set to be 0.01 μm/second to 1 μm/second (preferably, 0.3 μm/second), and the machining and removing amount is set to be 1 μm to 300 μm (preferably, 20 μm). FIG. 9 illustrates a result obtained by machining with an abrasive diamond grain of #600 under conditions that the number of rotations of a whetstone is 1800 min$^{-1}$, the number of rotations of a ScAlMgO$_4$ substrate is 100 min$^{-1}$, the machining speed is 0.3 μm/second, and the machining and removing amount is 20 μm. FIG. 9 illustrates a result obtained in a manner that flatness of a surface subjected to machining, in the X direction is measured by using a method similar to the above descriptions. As illustrated in FIG. 9, it is possible to form a regular unevenness shape, without forming a flat portion of 1 mm$^2$ or larger (site in which the area of a continuous region in which the height of an unevenness is equal to or less than 500 nm is equal to or larger than 1 mm$^2$) in a region functioning as an epitaxially-grown surface.

Next, the fine unevenness forming process in which an unevenness formed in the coarse unevenness forming process is gradually removed will be described. In the fine unevenness forming process, an unevenness having a height which is less than 500 nm is formed in a manner that polishing is performed at a pressing force which is weakened in stages, while the unevenness having a height of 500 nm or more is removed. In the fine unevenness forming process, it is preferable that slurry in which colloidal silica is used as the main component is used as an abrasive grain, the number of rotations is 10 min$^{-1}$ to 1000 min$^{-1}$ (preferably, 60 min$^{-1}$), the amount of supplied slurry is 0.02 ml/minute to 2 ml/minute (preferably, 0.5 ml/minute), and a non-woven fabric pad is used as a polishing pad. In the fine unevenness forming process, the pressing force is easily and selectively concentrated on the protrusions. Thus, it is preferable that the pressing force is set to be in a range of 10000 Pa to 20000 Pa for an initial time of the fine unevenness forming process, is set to be in a range of 5000 Pa or more and less than 10000 Pa while the protrusions become flat, and the pressing force is finally set to be in a range of 1000 Pa or more and less than 5000 Pa. As described above, the pressing force is reduced in stages, and thus it is possible to remove an unevenness having a height of 500 nm or more, from a region functioning as an epitaxially-grown surface, without an occurrence of cleaving in the inside.

Figure 10:
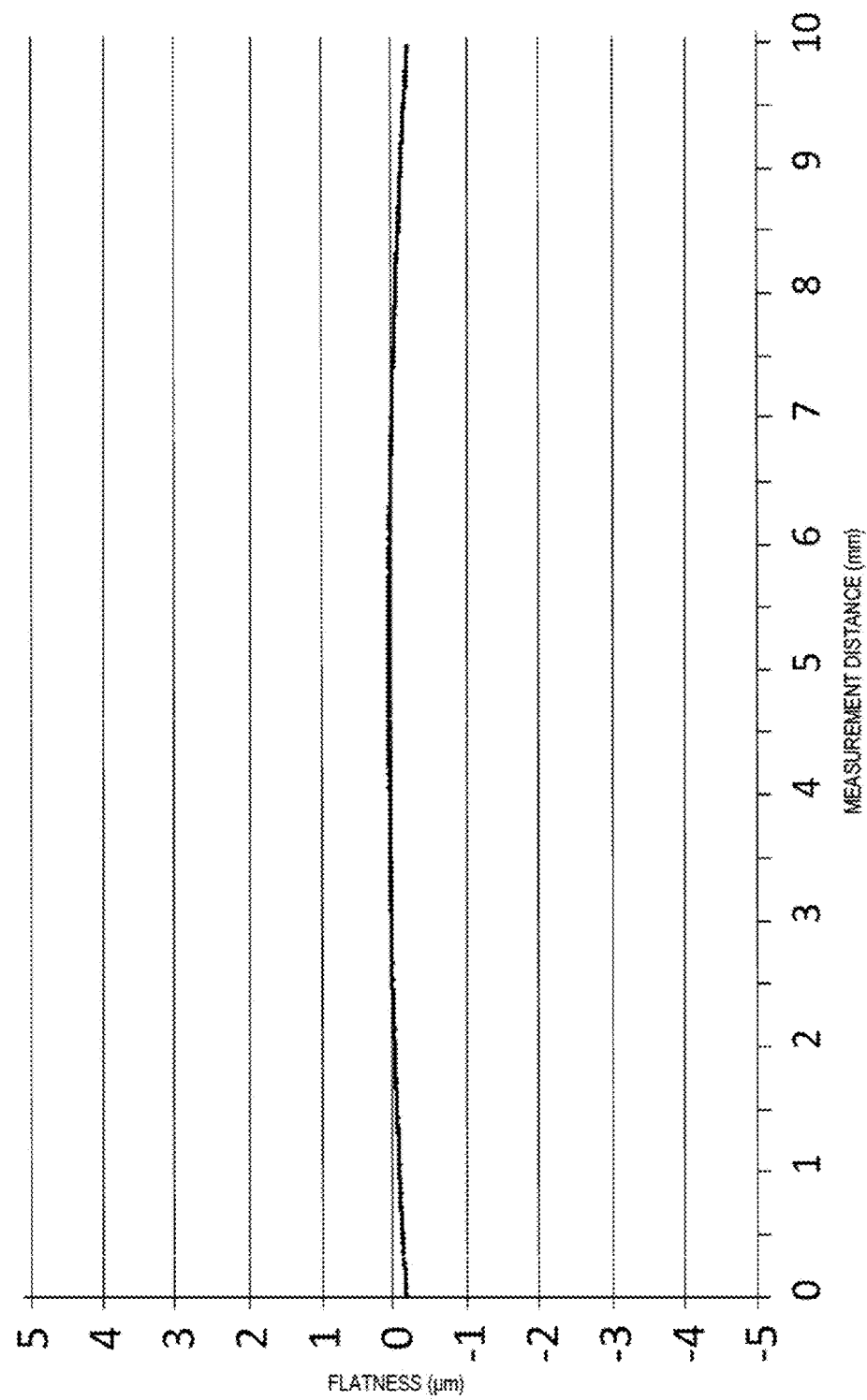
FIG. 10 is a diagram illustrating a result obtained by measuring flatness after polishing by a fine unevenness forming process is performed in the embodiment of the disclosure.
Figure 11:
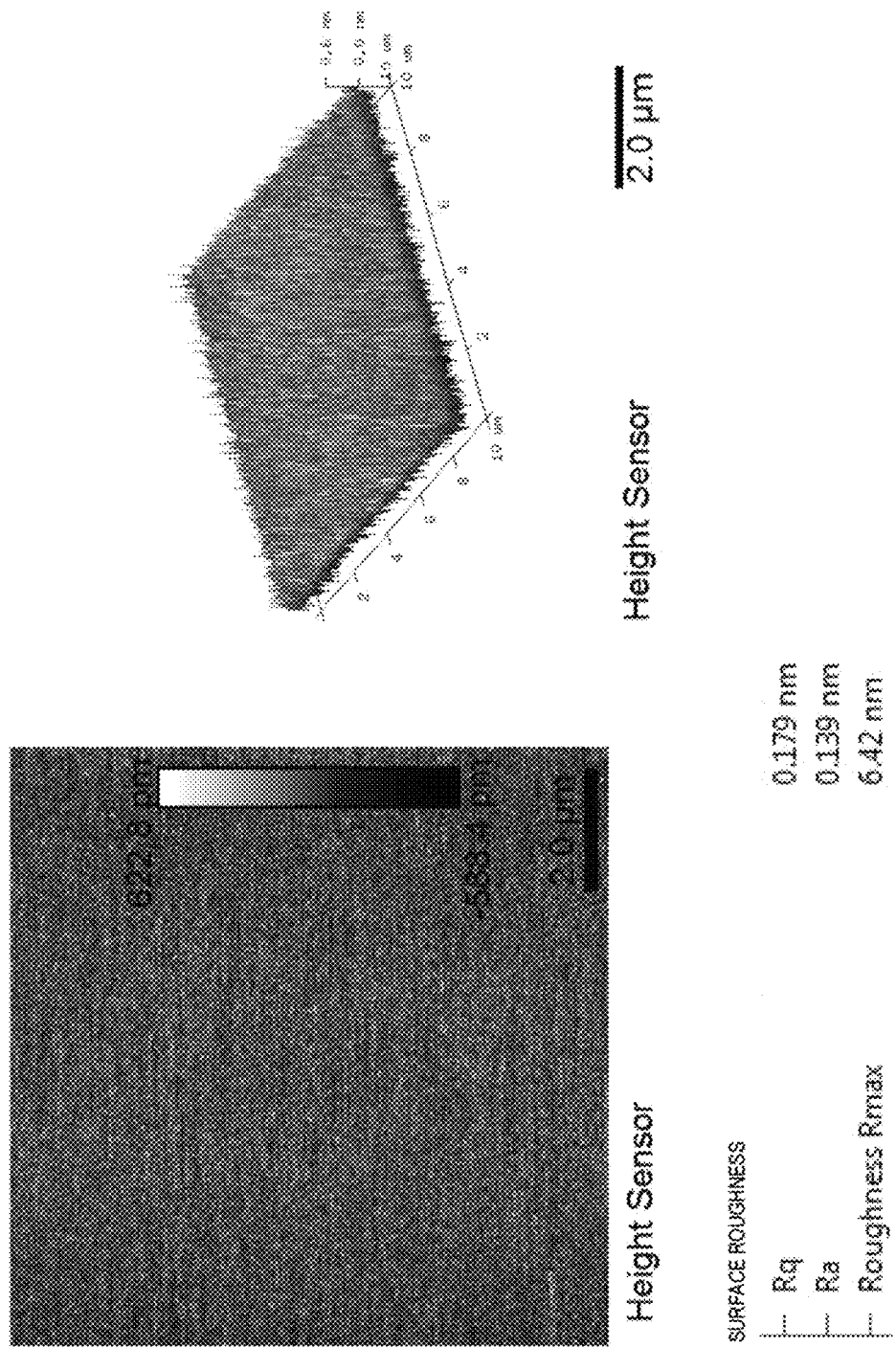
FIG. 11 is a diagram illustrating a result obtained by performing AFM measurement of the $ScAlMgO_4$ substrate according to the embodiment in the disclosure.

In the fine unevenness forming process, polishing is performed at 15000 Pa for three minutes, for the first time. Next, the pressing force is reduced up to 8000 Pa, and polishing is performed at 8000 Pa for five minutes. Finally, the pressing force is reduced up to 1000 Pa, and polishing is performed at 1000 Pa for 10 minutes. FIG. 10 illustrates results obtained by the above described process. FIG. 10 illustrates a surface shape measurement result obtained in a manner that flatness of a sectional shape of an epitaxially-grown surface after machining is measured by using a method similar to the above descriptions. FIG. 11 illustrates a surface shape measurement result obtained in a manner that a range of 10 μm angle of the epitaxially-grown surface is measured by an AFM (atomic force microscope). As illustrated in FIG. 11, an unevenness having a height of 500 nm or more is not provided in the range of 10 μm angle, and an unevenness having a height of 50 nm or more, in which Rmax indicating the maximum height is 6.42 nm is not observed. Rq is 0.179 nm. More detailed, it is understood that it is possible to form a very smooth surface in which surface roughness Ra in a small region of 100 μm$^2$ is 0.139 nm, and an unevenness of 50 nm or higher is not provided, based on FIG. 11 obtained by detailed shape analysis. The surface roughness Ra is 0.08 nm to 0.5 nm in the region of 100 μm$^2$ in the ScAlMgO$_4$ substrate formed by the above-described method. The surface roughness Ra is a value which is measured based on ISO13565-1 by using Dimension Icon manufactured by BRUKER Corporation.

In this manner, obtaining a smooth surface in which an unevenness formed by cleaving is not provided may be realized by a process as follows. Machining (coarse unevenness forming process) is performed to cause a smooth surface formed by cleaving to have an unevenness shape with intention and regularity. Then, the unevenness is removed little by little by machining in which cleaving does not occur (fine unevenness forming process). That is, according to the disclosure, a ScAlMgO$_4$ substrate having an epitaxially-grown surface in which the height of an unevenness is less than 500 nm, additionally, the height of an unevenness is equal to or less than 50 nm is obtained. Realizing the ScAlMgO$_4$ substrate is not possible by the conventional method. When surface roughness is observed, for example, in a range of 10 μm angle (100 μm$^2$), the surface roughness Ra on the surface of the substrate obtained by the above method is 0.08 nm to 0.5 nm. In this manner, for example, in a case where an LED light emission layer is formed on the epitaxially-grown surface of this substrate, a problem in that the above-described composition varies, light emission unevenness occurs in an LED element by the variation of the composition, or brightness is degraded does not occur. Further, the height of an unevenness is equal to or less than 50 nm, and thus an occurrence of formation poorness (for example, residue by etching a step portion) by the unevenness is suppressed, for example, when an electrode is formed after an LED light emission layer has been formed on an epitaxially-grown surface. Accordingly, manufacturing yield of a device such as an LED, which is manufactured by using this substrate is improved.

In the disclosure, the epitaxially-grown surface is formed only on one surface. The satin-finish surface is formed on another surface (back surface), as will be described later.

The epitaxially-grown surface may be configured of the single (0001) plane (cleavage surface). If a portion such as a defect or a foreign substance, which functions as a seed for accidental crystal growth is provided in the epitaxially-grown surface, when vapor phase growth of GaN is performed on the epitaxially-grown surface by, for example, a MOCVD method, Ga atoms may be concentrated on the seed for accidental crystal growth, and locally-ununiform growth may occur. In order to prevent an occurrence of such a case, the epitaxially-grown surface may include a plurality of cleavage surfaces which are separated from each other by steps, and are regularly distributed. When vapor phase growth of GaN is performed on a ScAlMgO$_4$ substrate by, for example, a MOCVD method, the Ga raw material moves (migrates) in the (0001) plane which is a cleavage surface of the epitaxially-grown surface, in a state where a portion of the Ga raw material is bonded to a methyl group. If the position of the Ga raw material is a stable position, the Ga raw material stops at this position. A bond with a methyl group is cut off, and the Ga raw material is bonded to N, and thus epitaxial growth is performed. Accordingly, the plurality of cleavage surfaces is formed on the epitaxially-grown surface, and step portions of cleavage surfaces which are adjacent to each other are caused to have stable positions, and are utilized. Thus, epitaxial growth is stabilized. The plurality of cleavage surfaces is formed to have regularity, and thus there is an advantage in that growth is regularly performed when epitaxial growth is performed on the epitaxially-grown surface by a MOCVD method.

Figure 12A:
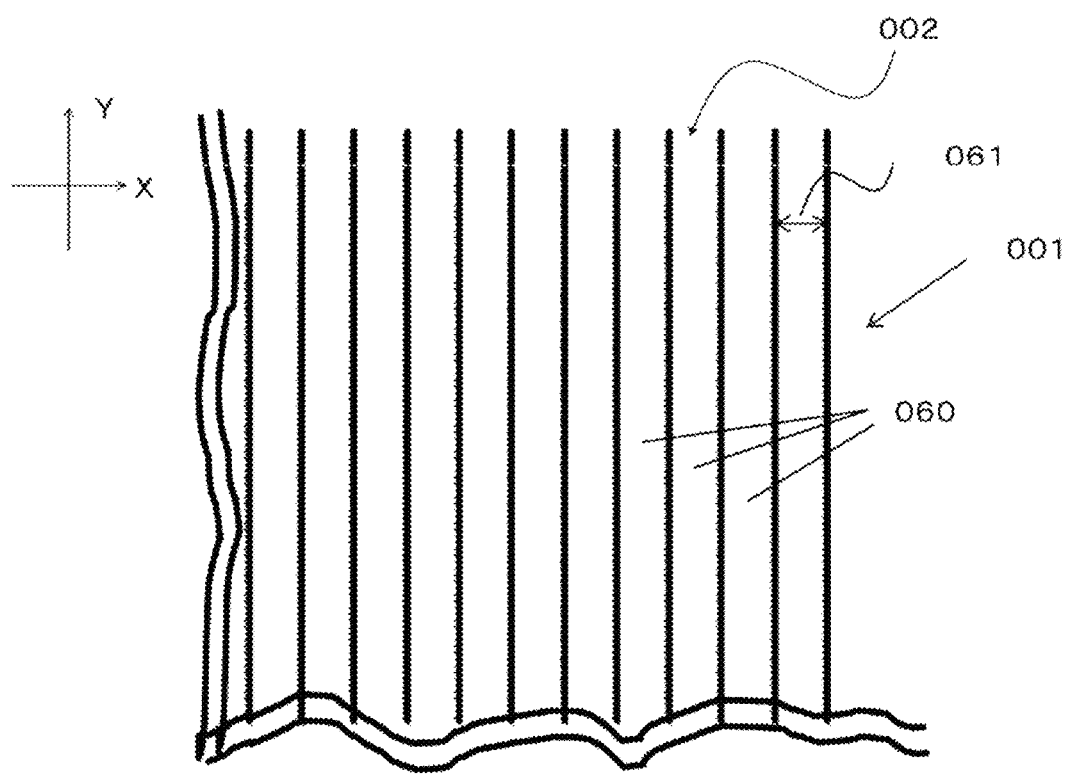
FIG. 12A is a plan view illustrating an epitaxially-grown surface of a $ScAlMgO_4$ substrate according to the embodiment, which includes a plurality of cleavage surfaces.
Figure 12B:
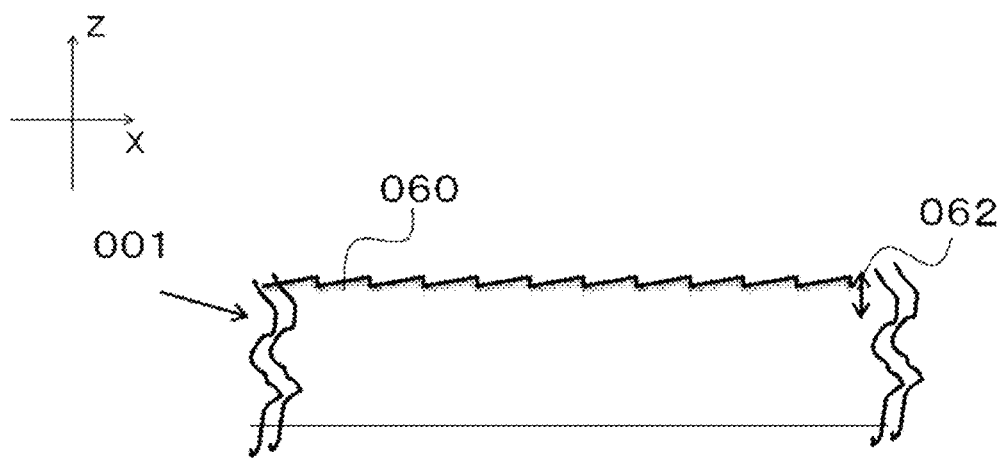
FIG. 12B is a side view illustrating the $ScAlMgO_4$ substrate.

FIGS. 12A-12B illustrate a $ScAlMgO_4$ substrate 001 including epitaxially-grown surface 002 which includes a plurality of cleavage surfaces 060. FIG. 12A is a plan view illustrating the $ScAlMgO_4$ substrate. FIG. 12B is a side view illustrating the $ScAlMgO_4$ substrate. As illustrated in FIG. 12A, in the $ScAlMgO_4$ substrate, it is preferable that cleavage surface 060 has a long shape, and a plurality of cleavage surfaces 060 is regularly formed in parallel to each other. The width of cleavage surface 060 in the X direction corresponds to cleavage surface width 061, and the step height between adjacent cleavage surfaces corresponds to height 062 between cleavage surfaces.

Here, cleavage surface width 061 is preferably set to move a Ga raw material to the step portion of the cleavage surface, which is a stable position, when epitaxial growth is performed by a MOCVD method. Specifically, in a case where epitaxial growth of GaN crystal is performed by a MOCVD method, if the cleavage surface width is set to be in a range of 1.5 nm to 500 nm, it is possible to form a uniform epitaxial film on the entirety of the epitaxially-grown surface. The reason is as follows. If the cleavage surface width is less than 1.5 nm, a stable position of the Ga raw material when epitaxial growth is performed is significantly close to the molecule size of the raw material molecule. Thus, realizing step flow growth (growth mode in which epitaxial growth proceeds from each step portion in a horizontal direction, and a uniform epitaxial film is obtained) in which a uniform epitaxial film is obtained may be not possible. If the cleavage surface width is equal to or more than 500 nm, a gap between the steps is much larger than a migration distance of the Ga raw material by a MOCVD method on a GaN surface (distance obtained by Ga raw material molecules moving on the epitaxially-grown surface from when the Ga raw material molecules adhere to the epitaxially-grown surface, until the Ga raw material molecules react with $NH_3$ molecules which are an N raw material, and GaN is obtained). Thus, similarly, realizing step flow growth is not possible. Furthermore, if the cleavage surface width is set to be in a range of 5 nm to 150 nm, it is possible to form an epitaxial film in which variation of a crystal orientation is uniformly small and impurity concentration is uniformly appropriate on the entirety of the epitaxially-grown surface. The reason is as follows. In a case where the cleavage surface width is set to be in a range of 5 nm to 150 nm, the cleavage surface width coincides with the migration distance of the Ga raw material by a MOCVD method on the GaN surface. Thus, most of Ga raw material molecules adhering to the surface migrate to the step portion of the cleavage surface. Thus, step flow growth proceeds well on the entirety of the epitaxially-grown surface of the $ScAlMgO_4$ substrate, a crystal orientation of a base is maintained, and a uniform epitaxial film is grown.

Here, a method of performing machining to set cleavage width surface 061 to be 1.5 nm to 500 nm will be described. FIG. 13 illustrates a diagram of a machining status in a case where a surface formed from a plurality of cleavage surfaces is subjected to machining. FIG. 13 is a sectional view of epitaxially-grown surface 002 in the X direction. An orientation of a force applied when machining with abrasive grain 070 is performed is an orientation of a resultant force formed from a resultant vector of a force for moving abrasive grain 070 in the X direction, and a force for moving abrasive grain 070 in a Z direction. In this case, an angle is formed between an abrasive grain moving direction, and the cleavage surface. In a case of being viewed from the entirety of epitaxially-grown surface 002, regarding a vector of a force applied to abrasive grain 070, a machining status varies depending on the size of an inclination angle. For example, machining is easily performed in a certain direction, and performing machining is difficult in a certain direction. Thus, in order not to form an unevenness on each of cleavage surfaces 060, it is necessary that the pressing force is set considering a state where an opening angle θ between a cleaving direction, and a vector direction of a force applied to the abrasive grain is large. Accordingly, it is necessary that final machining is performed in a state of pressure lower than that in a case where the cleavage surface is not divided into plural pieces. In addition, the range of the final pressing force in the fine unevenness forming process is set to be 20 Pa to 3000 Pa.

That is, in the above-described fine unevenness forming process, the plurality of cleavage surfaces can be formed by using slurry in which colloidal silica is contained as the main component and by using a polishing pad formed from a non-woven fabric pad. The formation is performed under conditions that the number of rotations of the polishing pad is set to be 10 $min^{-1}$ to 1000 $min^{-1}$, the amount of supplied slurry is set to be 0.02 ml/minute to 2 ml/minute, and the pressing force is set to be from 20 Pa to 20000 Pa. More detailed, in the fine unevenness forming process, the plurality of cleavage surfaces is formed at a pressing force which is sequentially weakened in an order of a range of 10000 Pa to 20000 Pa, a range of 5000 Pa or more and less than 10000 Pa, and a range of 20 Pa to 3000 Pa, while machining proceeds.

Figure 14:
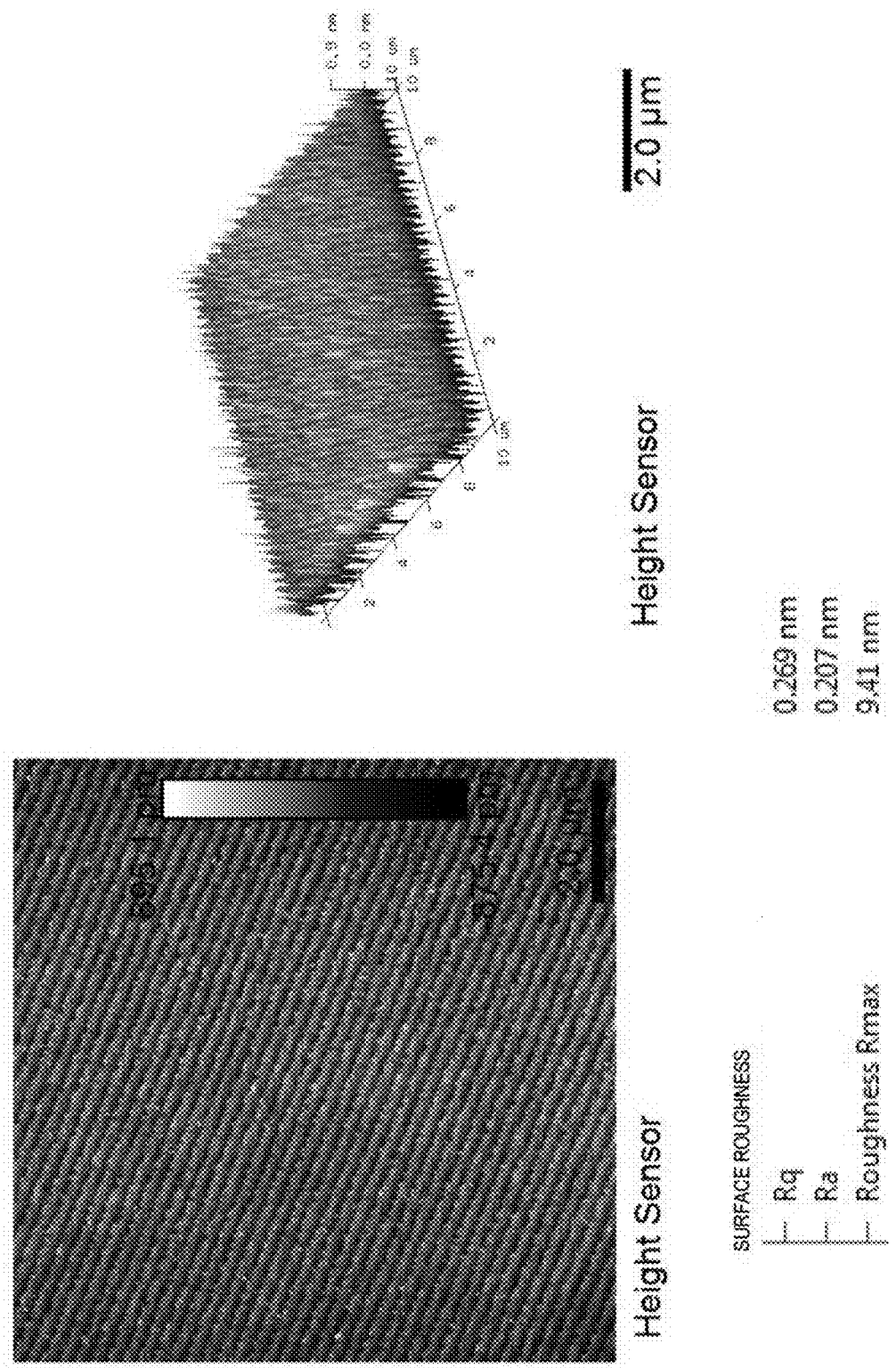
FIG. 14 is a diagram illustrating a result obtained by performing AFM measurement of the $ScAlMgO_4$ substrate according to the embodiment in the disclosure.

FIG. 14 illustrates a result obtained by performing polishing at the final pressing force decreased up to 200 Pa, for 10 minutes, in the fine unevenness forming process. Conditions other than the final pressing condition are the same as conditions when the $ScAlMgO_4$ substrate illustrated in FIG. 11 is obtained. FIG. 14 illustrates a surface shape measurement result obtained by performing measurement with an AFM in a range within 100 $\mu m^2$. As illustrated in FIG. 14, it is understood that epitaxially-grown surface 002 is formed from a plurality of long cleavage surfaces.

Here, the final pressing force in the fine unevenness forming process, when cleavage surface width 061 is set to be 1.5 nm to 500 nm is set to be in a range of 20 Pa to 3000 Pa. However, in a case where cleavage surface width 061 is set to be 5 nm to 150 nm, a range of an opening angle θ between a resultant vector of the pressing force applied to the abrasive grain and a cleavage direction is narrowed. Thus, the final pressing force may be set to be in a range of 100 Pa to 2800 Pa. That is, in a case where cleavage surface width 061 is set to be 5 nm to 150 nm, regarding a plurality of cleavage surfaces, the cleavage surface can be formed in a manner that pressing force is weakened in an order of a range of 10000 Pa to 20000 Pa, a range of 5000 Pa or more and less than 10000 Pa, and a range of 100 Pa to 2800 Pa, while machining proceeds.

Figure 15:
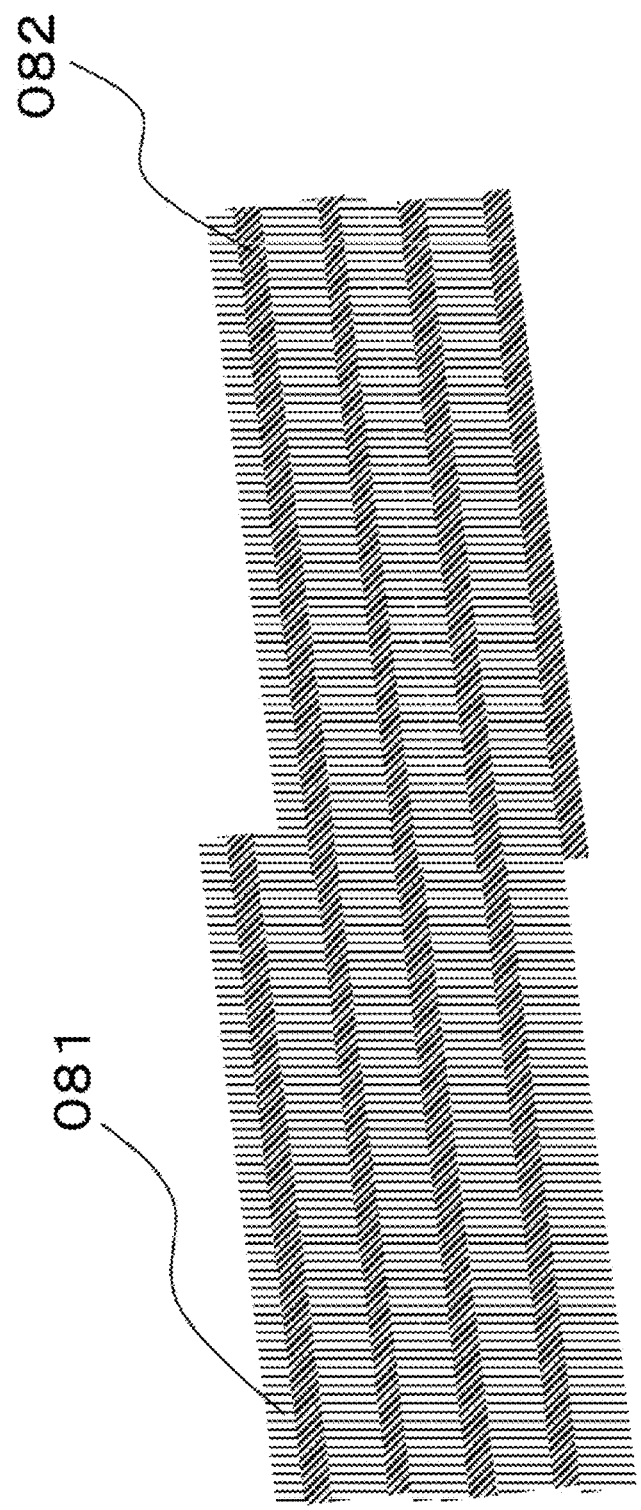
FIG. 15 is an enlarged view illustrating a section of two adjacent cleavage surfaces in an X-direction.

Here, height 062 between cleavage surfaces will be described. FIG. 15 illustrates an enlarged view of a section of two adjacent cleavage surfaces in the X direction. In FIG. 15, in a $ScAlMgO_4$ substrate formed from $MgAlO_2$ atomic layer 081 and $ScO_2$ atomic layer 082, $ScO_2$ atomic layer 082 is one layer, but $MgAlO_2$ layer 081 is obtained by stacking two layers. A portion between the layers in MgAlCO$_2$ layer 081 functions as the cleavage surface. Thus, the outermost surface is formed by one layer of MgAlO$_2$ layer 081. Regarding height 062 between the cleavage surfaces, the thickness of MgAlCO$_2$ atomic layer 081 corresponding to two layers, and ScO$_2$ atomic layer 082 corresponding to one layer is used as the minimum unit, in accordance with features of a cleavage portion considered from atomic arrangement of ScAlMgO$_4$. That is, the above-described thickness is set to be the minimum unit of height 062 between the cleavage surfaces in FIG. 12, and specifically, is about 0.8 nm.

In addition, in a case where epitaxial growth of GaN crystal is performed by using a MOCVD method, the height between cleavage surfaces is desirably equal to or less than a constant height, in order to suppress epitaxial growth from a wall surface of the step portion. The wall surface of the step portion has a crystal orientation different from that of the cleavage surface. Accordingly, crystal which is epitaxially grown on the wall surface may easily cause problems in that impurity concentration is different or yield of epitaxial growth is reduced because this crystal is a cause of generation of polycrystal, in comparison to crystal which is epitaxially grown on the cleavage surface. Specifically, if the height between cleavage surfaces is set to be in a range of one time to ten times the minimum unit, generation of polycrystal is suppressed, and yield of epitaxial growth is improved. That is, height 062 between cleavage surfaces is preferably set to be 0.8 nm to 8 nm. In order to form height 062 between cleavage surfaces so as to be 0.8 nm to 8 nm, machining is performed such that an epitaxially-grown surface as a result of performing machining at the final pressing force is measured in a range of 100 μm$^2$ by using an AFM, and as a result, the surface roughness Ra is 0.08 m to 1.5 nm.

In addition, if the height between cleavage surfaces is set to be in a range of one time to four times the minimum unit, an epitaxial film in which impurity concentration is uniform in the entirety of an epitaxially-grown surface in addition to suppression of generating polycrystal is obtained well. That is, height 062 between cleavage surfaces is more preferably set to be 0.8 nm to 3.2 nm. In order to form height 062 between cleavage surfaces so as to be 0.8 nm to 3.2 nm, machining is performed such that an epitaxially-grown surface as a result of performing machining at the final pressing force is measured in a range of 100 μm$^2$ by using an AFM, and as a result, the surface roughness Ra is 0.08 nm to 1.0 nm.

Here, details of a method of forming an epitaxially-grown surface in the manufacturing method according to the disclosure will be collectively described. An epitaxially-grown surface is formed by the coarse unevenness forming process and the fine unevenness forming process. In the coarse unevenness forming process, the unevenness of 500 nm or higher is formed by using a whetstone to which abrasive diamond grains of #300 to #2000 are attached. The unevenness is formed under the following machining conditions. The number of rotations of the whetstone is set to be 500 min$^{-1}$ to 50000 min$^{-1}$. The number of rotations of the ScAlMgO$_4$ plate is set to be 10 min$^{-1}$ to 300 min$^{-1}$. The machining speed is set to be 0.01 μm/second to 1 μm/second. The machining and removing amount is set to be 1 μm to 300 μm. In the fine unevenness forming process, removing the unevenness (forming an unevenness which is lower than 500 nm) is performed by using slurry in which colloidal silica is contained as the main component and by using a polishing pad formed from a non-woven fabric pad. The formation is performed under the following machining conditions. The number of rotations of the polishing pad is set to be 10 min$^{-1}$ to 1000 min$^{-1}$. The amount of supplied slurry is set to be 0.02 ml/minute to 2 ml/minute. The pressing force is set to be 1000 Pa to 20000 Pa. Further, the pressing force is weakened in an order of a range of 10000 Pa to 20000 Pa, a range of 5000 Pa or more and less than 10000 Pa, and a range of 1000 Pa or more and less than 5000 Pa. Thus, it is possible to more precisely form the unevenness which is lower than 500 nm. In a case where a plurality of cleavage surfaces is formed on the epitaxially-grown surface, the final pressing force in the fine unevenness forming process is set to be 20 Pa to 3000 Pa.

In the disclosure, when a surface (back surface) on an opposite side of an epitaxially-grown surface is formed (satin-finish surface forming process), a machining method as will be described in detail below is employed considering features of a ScAlMgO$_4$ material.

Figure 16:
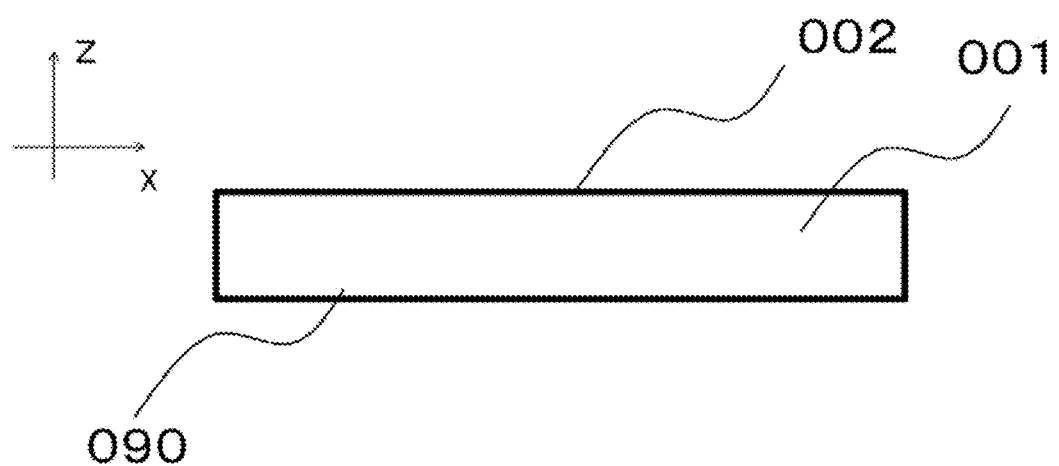
FIG. 16 is a diagram illustrating a $ScAlMgO_4$ substrate which has a satin-finish surface according to the disclosure.
Figure 17:
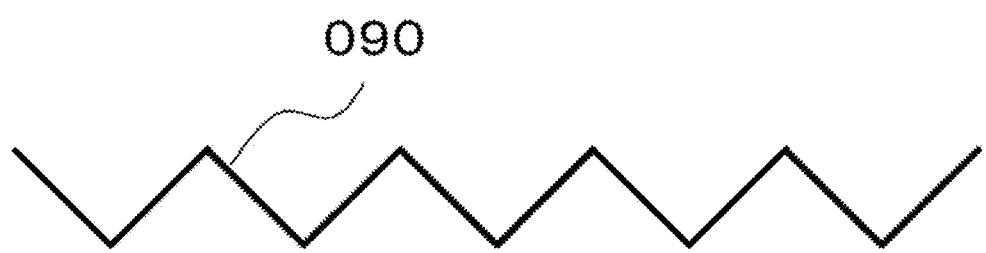
FIG. 17 is a partial enlarged view illustrating a section of the $ScAlMgO_4$ substrate which has a satin-finish surface according to the disclosure.

In the ScAlMgO$_4$ substrate according to the disclosure, as illustrated in FIG. 16, the back surface of epitaxially-grown surface 002 may be set as satin-finish shape 090. FIG. 16 illustrates ScAlMgO$_4$ substrate 001 which includes satin-finish shape 090. FIG. 17 illustrates an enlarged view of the section of satin-finish shape 090. Satin-finish surface 090 is provided on the back surface of the ScAlMgO$_4$ substrate, and thus the front surface and the back surface of ScAlMgO$_4$ substrate 001 can be distinguished from each other. When ScAlMgO$_4$ substrate 001 is transported, satin-finish surface 090 functions as slip resistance. Thus, it is possible to suppress an occurrence of damage or defects by slipping and collision of ScAlMgO$_4$ substrate 001 during the transportation. Satin-finish surface 090 has surface roughness Ra larger than that of epitaxially-grown surface 002. For example, even in a case where a plurality of cleavage surfaces 060 is formed in epitaxially-grown surface 002, satin-finish shape 090 has the largest surface roughness. Specifically, the surface roughness Ra of epitaxially-grown surface 002 formed from a single cleavage surface is preferably 0.08 nm to 0.5 nm. In a case where a plurality of cleavage surfaces is provided, the surface roughness Ra of epitaxially-grown surface 002 is 0.08 nm to 1.5 nm. However, the surface roughness of satin-finish surface 090 is preferably 500 nm to 8000 nm. The surface roughness is a value measured in a region of 100 μm$^2$. In the ScAlMgO$_4$ substrate according to the disclosure, a substantially-uniform unevenness is preferably formed on the entire surface of the back surface in epitaxially-grown surface 002. Specifically, an unevenness is preferably formed on the surface on "which a substantially-uniform unevenness is formed without irregularity" such that an area of a region in which the height of the continuous unevenness is equal to or less than 500 nm is equal to or smaller than 1 mm$^2$. If the unevenness is locally formed, when the epitaxially-grown surface side is subjected to machining, light is reflected from a flat region on the back surface side, and the reflected light may influence exposure.

In the disclosure, it is preferable that the height of the unevenness shape in epitaxially-grown surface 001 is equal to or less than 500 nm, but the height of the unevenness shape in satin-finish shape 090 is equal to or more than 500 nm. The height of the unevenness is a value obtained by measurement in the above-described laser reflection type measuring device. The reason is as follows. In a case where the back surface of the epitaxially-grown surface of the ScAlMgO$_4$ substrate is not a satin-finish shape in which an unevenness having a height of 500 nm or more is provided, in a process of manufacturing a device by using this substrate, as described above, reflected light from the back surface may influence the exposure. In addition, distinguishment between the front surface and the back surface is difficult in handling, and thus confusion may occur, or slipping may easily occur when the substrate is installed on a flat surface such as the stage of a manufacturing device. The height of the unevenness shape is preferably equal to or less than 500 µm. The reason is because, if an unevenness of 500 nm or more is provided, for example, stress may be easily concentrated from the provided unevenness as a starting point. An unevenness having a substantially-uniform height being provided on satin-finish surface 090 specifically means that an unevenness shape of 0.5 µm to 500 µm is provided.

The satin-finish surface having an unevenness which has a substantially-uniform height can be formed by grinding which uses a diamond-fixed abrasive grain having a large abrasive grain size. An abrasive diamond grain of #300 to #2000 as the abrasive grain size is used. More preferably, an abrasive diamond grain of #600 is used. Satin-finish surface 090 is formed by using a whetstone, to which an abrasive diamond grain of #300 to #2000 is attached. The formation is performed under the following machining conditions. The number of rotations of the whetstone is 500 $min^{-1}$ to 50000 $min^{-1}$. The number of rotations of the $ScAlMgO_4$ plate is 10 $min^{-1}$ to 300 $min^{-1}$. The machining speed is 0.01 µm/second to 1 µm/second. The machining and removing amount is 1 µm to 300 µm. A difference in height between a plurality of unevennesses can be reduced more by using an abrasive diamond grain of #600. At this time, machining conditions as follows are preferable. The number of rotations of the whetstone is set to be 1800 $min^{-1}$. The number of rotations of the $ScAlMgO_4$ substrate is set to be 100 $min^{-1}$. The machining speed is set to be 0.3 µm/second. The machining and removing amount is set to be 20 µm.

In order to remove an influence of an affected layer by machining, grinding or blast machining for forming the affected layer may be performed.

A protective layer formed from one layer or a plurality of layers may be provided on the back surface (satin-finish surface) of the $ScAlMgO_4$ substrate according to the disclosure. As described above, $ScAlMgO_4$ has high cleavage properties. Thus, when the $ScAlMgO_4$ substrate is transported or when the epitaxially-grown surface side is subjected to machining, if a load is applied to the back surface side of the $ScAlMgO_4$ substrate, that is, to the satin-finish surface side, a portion of the satin-finish surface may be cracked or exfoliated. On the contrary, if the protective layer is formed on the back surface side of the $ScAlMgO_4$ substrate, an occurrence of such crack or exfoliation is suppressed. In the disclosure, since the back surface of the $ScAlMgO_4$ substrate is a satin-finish surface, there is also an advantage in that adhesiveness between the $ScAlMgO_4$ substrate and the protective layer is good, and thus peeling of the protective layer is difficult.

A layer formed from $SiO_2$, AlN, carbon, SiN, $Al_2O_3$, GaN, or the like can be used as the protective layer formed on the satin-finish surface. Such a protective layer can be formed by, for example, a physical vapor deposition (PVD) method such as a sputtering method, a vacuum evaporation method, or an ion plating method, a chemical vapor phase deposition (CVD) method such as a plasma CVD method or light CVD method.

The thickness of the protective layer can be set to be 0.1 µm to 5 µm. The thickness of the protective layer is set to be in the above range, and thus it is possible to sufficiently protect the satin-finish surface. The thickness of the protective layer may be thinner than the thickness of the $ScAlMgO_4$ substrate. The thickness of the protective layer is preferably 0.1 µm to 1 µm. Further, in a case where the protective layer is formed from a plurality of layers, the protective layer may have a configuration in which the layer which is closer to the satin-finish surface has a thicker thickness. The protective layer is set to be a multilayer film in which the thickness is gradually changed, for example, the thickness becomes thicker as the layer becomes closer to the satin-finish surface. Thus, it is possible to achieve both adhesiveness and solidity.

Here, the above-described epitaxially-grown surface is a surface on which another type of crystal is epitaxially grown on crystal functioning as a substrate. For example, the epitaxially-grown surface may be set to be a region on an inner side of 5 mm or more from an outer circumference of the substrate. Epitaxial growth is a growth form of crystal in which new crystal is aligned and arranged to a crystal surface of the substrate on the base. Crystal of a compound semiconductor such as a nitrogen compound of the III group may be grown on the epitaxially-grown surface by a vapor phase growth method such as MOCVD method, a metal-organic vapor phase epitaxy (MOVPE) method, and a hydride vapor phase epitaxy (HVPE) method, or a liquid phase growth method such as a flux method.

MOCVD growth of GaN is described as a method of performing epitaxial growth on the $ScAlMgO_4$ substrate. However, in a case of growth of AlGaInN crystal obtained by adding Al or In to GaN, similar advantages are also obtained.

The growing method is also not limited to MOCVD. Other growing methods may be used together, for example, HVPE growth or a method of performing HVPE growth after MOCVD growth. Regarding the growth temperature, the $ScAlMgO_4$ substrate may be applied to a form in which an AlGaInN buffer layer is grown at a low temperature of about 500° C. to 600° C., and then growth of GaN crystal is performed at a high temperature of 1000° C. or higher. The $ScAlMgO_4$ substrate may be applied to a form in which a light emitting device, a power device, and the like is formed by creating hetero junction of the same AlGaInN on the AlGaInN crystal layer.

Other Embodiments

In the above-described embodiment, a substrate obtained from single crystal of $ScAlMgO_4$ is described among substrates formed from single crystal which is represented by the formula $RAMO_4$. However, the disclosure is not limited thereto.

The substrate according to the disclosure is configured from a substantially single crystal material which is represented by the formula $RAMO_4$. In the formula, R indicates one or a plurality of trivalent elements selected from Sc, In, Y, and a lanthanoid element (atomic number 67 to 71). A indicates one or a plurality of trivalent elements selected from Fe(III), Ga, and Al. M indicates one or a plurality of bivalent elements selected from Mg, Mn, Fe(II), Co, Cu, Zn, and Cd. The substantially single crystal material refers to crystalline solid, for example, which contains $RAMO_4$ constituting an epitaxially-grown surface, so as to be equal to or more than 90 at %, and an orientation of any portion of the epitaxially-grown surface is the same when focusing on a certain crystal axis. However, a matter in which an orientation of a crystal axis locally varies, or a matter which includes a localized lattice defect is also handled as single crystal. O indicates oxygen. As described above, it is desirable that R is set to be Sc, A is set to be Al, and M is set to be Mg.

When an LED element in which an LED light emission layer is grown on a substrate during MOCVD vapor phase growth is manufactured, a substrate according to the disclosure is used, and thus an occurrence of light emission unevenness and degradation of brightness as an LED element may be prevented.

What is claimed is:

1. A $RAMO_4$ substrate comprising a single crystal represented by a formula of $RAMO_4$ (in the formula, R indicates one or a plurality of trivalent elements selected from a group consisting of Sc, In, Y, and a lanthanoid element, A indicates one or a plurality of trivalent elements selected from a group consisting of Fe(III), Ga, and Al, and M indicates one or a plurality of bivalent elements selected from a group consisting of Mg, Mn, Fe(II), Co, Cu, Zn, and Cd), wherein
   an epitaxially-grown surface is provided on a first surface of the $RAMO_4$ substrate,
   a satin-finish surface is provided on a second surface of the $RAMO_4$ substrate, and
   the satin-finish surface has surface roughness which is larger than a surface roughness of the epitaxially-grown surface, the satin-finish surface having an unevenness of 0.5 μm to 500 μm, and
   surface roughness Ra in a region of 100 $m^2$ of the epitaxially-grown surface is at least 0.08 nm and no greater than 0.5 nm.

2. The $RAMO_4$ substrate of claim 1, wherein
   surface roughness Ra in a region of 100 $m^2$ of the satin-finish surface is at least 0.5 μm and no greater than 8 μm.

3. The $RAMO_4$ substrate of claim 1, wherein
   a protective layer including one layer or a plurality of layers is provided on the satin-finish surface.

4. The $RAMO_4$ substrate of claim 1, wherein
   a protective layer including a plurality of layers is provided on the satin-finish surface, and
   a thickness of each of the plurality of layers increases as the layers become closer to the satin-finish surface.

5. The $RAMO_4$ substrate of claim 1, wherein
   in the formula, R indicates Sc, A indicates Al, and M indicates Mg.

* * * * *